(12) United States Patent
Jewell et al.

(10) Patent No.: US 7,761,681 B2
(45) Date of Patent: Jul. 20, 2010

(54) DATA STORAGE SYSTEM WITH PERSISTENT VOLATILE MEMORY ACROSS POWER FAILURES

(75) Inventors: Colin Robert Jewell, Southampton (GB); Robert Bruce Nicholson, Southsea (GB); Huw Michael Francis, Compton (GB); David Mark Lee, Southampton (GB)

(73) Assignee: International National Machines Corporation, Armonk, NY (US)

( * ) Notice: Subject to any disclaimer, the term of this patent is extended or adjusted under 35 U.S.C. 154(b) by 0 days.

(21) Appl. No.: 11/868,076

(22) Filed: Oct. 5, 2007

(65) Prior Publication Data

US 2008/0025126 A1 Jan. 31, 2008

Related U.S. Application Data

(63) Continuation of application No. 10/929,744, filed on Aug. 30, 2004, now abandoned.

(30) Foreign Application Priority Data

Aug. 28, 2003 (GB) ................................. 0320142.3

(51) Int. Cl.
*G06F 12/16* (2006.01)
(52) U.S. Cl. ..................... 711/165; 711/113; 711/137; 711/161; 711/162; 711/163; 711/167
(58) Field of Classification Search ................. 711/113, 711/137, 161, 162, 163, 165, 167
See application file for complete search history.

(56) References Cited

U.S. PATENT DOCUMENTS

| 5,404,539 | A  | * | 4/1995  | Onozaki ........................ 710/240 |
| 5,671,204 | A  | * | 9/1997  | Yokouchi et al. .......... 369/47.33 |
| 6,246,933 | B1 | * | 6/2001  | Bague ........................... 701/35 |
| 2002/0080771 | A1 | * | 6/2002  | Krumel ........................ 370/352 |
| 2002/0169928 | A1 | * | 11/2002 | Kimura et al. .............. 711/137 |
| 2004/0039961 | A1 | * | 2/2004  | Itoh et al. ....................... 714/15 |

* cited by examiner

*Primary Examiner*—Tuan V Thai
*Assistant Examiner*—Midys Rojas
(74) *Attorney, Agent, or Firm*—Dillon & Yudell LLP

(57) ABSTRACT

A storage adapter for use in a data storage subsystem includes a controlling processor, a volatile memory, and a nonvolatile memory "dump device." The storage adapter also includes a battery that can be used to provide sufficient power to the storage adapter to allow data from the volatile memory to be written to the nonvolatile memory of the storage adapter under the control of the processor in the event of an interruption or failure in the main power supply to the storage adapter, i.e. to preserve data stored in the volatile memory in that event. The processor uses the current state of charge of the battery to determine the amount of data that can be "dumped" to the nonvolatile dump device before the battery is depleted.

20 Claims, 3 Drawing Sheets

DATA STORAGE SYSTEM WITH PERSISTENT VOLATILE MEMORY ACROSS POWER FAILURES

RELATED APPLICATION DATA

The present application is a continuation application of U.S. patent application Ser. No. 10/929,744, entitled "Data Storage Systems," filed on Aug. 30, 2004, now abandoned which claimed priority of United Kingdom Patent Application No. 0320142.3, filed on Aug. 28, 2003, and entitled, "Data Storage Systems."

BACKGROUND OF THE INVENTION

1. Technical Field

The present invention relates to data storage systems and more particularly to storage systems that are arranged to "dump" the contents of a volatile memory in the event of a power failure so as to make the contents of the volatile memory persistent across power failures.

2. Description of Related Art

Many computer systems include a so called "storage subsystem" for storing data. Such a storage subsystem will typically comprise one or more adapters, controllers and disks, such as, for example, a redundant array of independent disks (a RAID system). It can often be the case in such storage subsystems for data that is to be written to the main nonvolatile memory, e.g. disk array, to first be stored temporarily in a local faster, volatile cache memory before it is stored on the disk drive. One example of this type of operation is so called "fast write caching", in which data to be stored is first written to a volatile memory, so that the application storing the data can then be freed to proceed with another write operation without needing to wait until the data has been written to the disk drive (which can take a relatively long time).

The cache memory used to temporarily store the data before it is written to a disk drive in such systems is usually of a volatile type, since such memories are usually faster and smaller than nonvolatile storage devices. However, this then has the disadvantage that data stored in the cache memory could be lost in the event of a power failure (since that data has yet to be written to the nonvolatile memory, but will, typically, have been assumed to have already safely been stored in nonvolatile memory by the applications using the storage subsystem (such that the applications will no longer continue to preserve that data)). There is therefore a need in such systems to maintain the integrity of the data stored in the volatile memory in the event of a power failure or interruption.

As well as for fast write caching, the need to maintain the integrity of data stored in a volatile memory in the event of a power failure or interruption can also be important in, e.g. RAID functions or copy services.

It would be possible to reduce the risk of data loss from the volatile memory in the event of a power failure or interruption by providing, e.g., a reserve battery supply for maintaining the volatile memory in the event of a power failure. However, the Applicants have found that that can lead to significantly reduced performance.

It has also been suggested therefore to provide in such systems an arrangement whereby an e.g., memory controller, can dump the contents of the cache memory to a nonvolatile memory using an auxiliary or backup power supply such as a battery in the event that a power failure is detected. This preserves the data in the cache memory and allows it to be retrieved from where it was "dumped" to once power is restored so that it can then be properly written to the, e.g., disk drives of the storage subsystem. U.S. Pat. No. 5,748,844 describes one such prior art system. An advantage of this type of system is that the battery power required to dump the data to the nonvolatile memory may be less than that required to, e.g., maintain the volatile memory for any significant period of time.

Volatile memory that is protected, e.g., by the ability to dump its contents to a nonvolatile memory, in the event of a power failure or interruption is often referred to as "persistent" memory, since its contents will persist (and be preserved) across power supply failures.

However, one drawback that the Applicants have recognised with "data dumping" systems, is that once a power failure has occurred and the contents of the volatile memory dumped under battery power, there may then be insufficient capacity remaining in the battery to carry out another "data dump" in the event of another power failure until such time as the battery has been recharged. However, it could take, e.g., up to one hour for the battery to be fully charged again, during which time use of the volatile memory may have to be suspended if the risk of data loss is to be avoided.

This problem could be reduced by using, e.g., a sufficiently large or oversize battery, or more than one battery, but that may not always be practicable or desirable and such a battery or batteries could still in some circumstances become exhausted. Another approach might be to mirror the system so that there is a backup volatile memory and battery but again that may not always be practicable or desirable.

The Applicants believe therefore that there remains scope for improvements to existing memory schemes where the contents of a volatile memory are protected by a battery-powered "data dump" to a nonvolatile storage device in the event of a power failure.

SUMMARY OF THE INVENTION

Thus, the present invention includes a storage adapter for use in a data storage subsystem includes a controlling processor, a volatile memory, and a nonvolatile memory "dump device." The storage adapter also includes a battery that can be used to provide sufficient power to the storage adapter to allow data from the volatile memory to be written to the nonvolatile memory of the storage adapter under the control of the processor in the event of an interruption or failure in the main power supply to the storage adapter, i.e. to preserve data stored in the volatile memory in that event. The processor uses the current state of charge of the battery to determine the amount of data that can be "dumped" to the nonvolatile dump device before the battery is depleted.

The above, as well as additional purposes, features, and advantages of the present invention will become apparent in the following detailed written description.

BRIEF DESCRIPTION OF THE DRAWINGS

A number of preferred embodiments of the present invention will now be described by way of example only and with reference to the accompanying drawings, in which.

DETAILED DESCRIPTION OF THE PREFERRED EMBODIMENT

Figure 1:
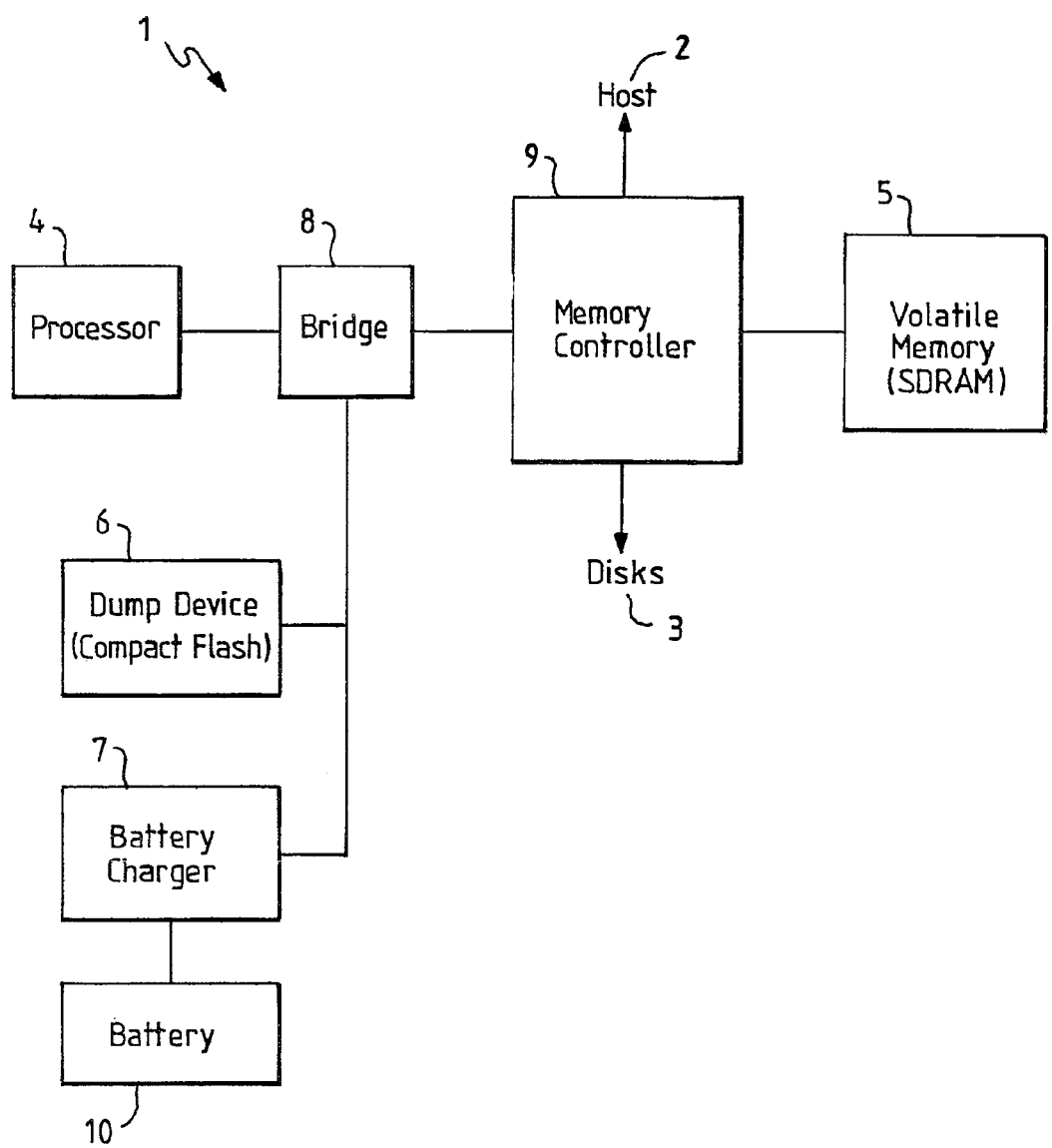
FIG. 1 shows schematically a storage adapter that can be used in accordance with the present invention.

According to a first aspect of the present invention, there is provided an apparatus for protecting data in a data storage subsystem in the event of a power loss. The apparatus is logically positioned between a host computer and a hard drive. The apparatus includes a volatile memory that stores a mirror copy of data being sent from the host computer to the hard drive. In the event of a power loss, data that was lost by system memory and cache memory in the host computer, and which had not yet been stored in the hard drive, is sent from the volatile memory in the apparatus to a low-power flash memory. When the host computer regains power, then the data in the flash memory is restored in the volatile memory in the apparatus. The volatile memory then sends the data, either directly or through the host computer, to the hard drive for persistent storage. In a preferred embodiment, the apparatus includes means for determining the amount of stored power in the battery, and means for determining the amount of data stored in the volatile memory that can be written to the flash memory, based on the amount of stored power in the battery.

Knowing the amount of data in the volatile memory that can be protected by the temporary power supply at any given time, facilitates, for example, instead of, as in the prior art, having to suspend use of the volatile memory until the temporary power supply is fully recharged if data integrity is to be preserved after a power supply interruption, still using the storage subsystem "normally" using the volatile memory, since the storage subsystem can, e.g., be (and preferably is) controlled not to store more data in the volatile memory than the determined amount of data that can be "protected" using the current determined capacity of the temporary power supply.

The present invention therefore facilitates, for example, use of the volatile memory (at least up to the data amount that can be protected) to be resumed immediately or at least shortly after a power supply interruption and without the need to wait for the temporary power supply to be fully recharged. This facilitates, e.g., the storage subsystem returning to its normal mode of operation using the volatile memory more swiftly than in prior art such systems.

The volatile memory of the storage subsystem of the present invention can be any suitable such memory. It could, as discussed above, for example, be a cache memory, such as a write cache in a storage subsystem. It is preferred for the volatile memory to be "high performance".

The nonvolatile memory can similarly be any suitable such memory. It is particularly preferred for the nonvolatile memory to one that is compact and that can be written to with a relatively low power consumption, as that, e.g., facilitates fitting the nonvolatile memory onto a storage adapter, and the transfer of data to the nonvolatile memory to be powered by a relatively low power, power source, such as a (relatively small) battery (which can accordingly be smaller in size). It is accordingly preferred for the nonvolatile memory to be separate from, and additional to, the "main" nonvolatile memory, e.g., disk drive array, of the storage subsystem. In a particularly preferred embodiment, the nonvolatile memory comprises a flash memory or a "micro" disk drive.

The temporary power supply can be any suitable such power supply. It should be able to provide enough power to write the data from the volatile memory to the nonvolatile memory, but does not otherwise have to be able to power any remaining components of the overall storage subsystem. Thus, for example, where, as discussed above, the nonvolatile memory is in the form of an additional, auxiliary memory device, the temporary power supply would not need to (and preferably does not) power the main hard disk array of the storage subsystem. The temporary power supply is preferably uninterruptible. In a particularly preferred embodiment it comprises a (rechargeable) battery.

The state of the temporary power supply that is determined should be such that the amount of data that can be written to the nonvolatile memory with the power supply in its determined state can be determined. Thus, for example, in the case of a battery-based power supply, the capacity or state of charge of the battery could be determined. This could be done, e.g., by determining and storing in advance the charging and discharging characteristics of the battery, the fully charged capacity of the battery and how long it can run the system for when fully charged. By then measuring how long the battery charges and discharges for when in use and using this previously determined information, the current state of the battery can be determined.

The determination of the state of the temporary power supply should be such as to provide at least a reasonable indication of the "current" state of the temporary power supply. Thus, it is preferably determined at regular intervals, such as every minute or every few minutes, and/or in response to the occurrence of a particular event or events. The current state of charge of the temporary power supply should be recorded in nonvolatile memory so that it also survives any power supply failure. It is preferably stored in a non-volatile memory device, such as an EEPROM (Electronically Erasable Programmable Read-Only Memory), mounted on the temporary power supply, e.g. battery, itself.

The amount of data that can be written to the nonvolatile memory using the temporary power supply can be determined in any desired and suitable manner. Thus, this amount could, e.g., be determined using the known characteristics of the nonvolatile memory to which the data is to be "dumped" to. For a solid-state, flash nonvolatile memory there will typically be a linear relationship between the amount of power available and the amount of data that can be "dumped". For a "microdrive", a more sophisticated conversion may be necessary.

Preferably the maximum possible amount of data that could be transferred to the nonvolatile memory is determined, and the amount of data to be transferred then set to a value that is a selected, preferably predetermined, margin less than that amount. This "safety" margin could, e.g., be based on the estimated accuracy of the determined current state of the temporary power supply and of the determined amount of data that can be "dumped" using the temporary power supply in that state.

The interruption of the (non-temporary) power supply to the memory storage system (thereby triggering a switch to data storage using the temporary power supply) can be detected in any suitable manner known in the art.

It will be appreciated from the above that, at least where the temporary power supply is not in its fully charged state, the amount of data that can be transferred to the nonvolatile memory in the event of a power interruption may well be less than the amount of data that is actually stored in the volatile memory (i.e. such that not all of the contents of the volatile memory can be transferred to the nonvolatile memory using the temporary power supply). Indeed, this would also be the case where the volatile memory has a data capacity that is larger than the amount of data that can be transferred to the nonvolatile memory using the temporary power supply even when the temporary power supply is fully charged (which may be desirable in some circumstances, such as, for example, where a relatively large volatile memory capacity is required, but not all the data stored in the volatile memory at any given time may need to be preserved across power interruptions).

Thus in a particularly preferred embodiment, data stored in the volatile memory is denoted as either being data that should be "dumped" (i.e. written (copied)) to the nonvolatile memory in the event of a power interruption, or as data that does not need to be so dumped. This could be done by, e.g., the data that will be written to the nonvolatile memory (and thereby will be preserved in the event of a power interruption) being marked appropriately, e.g. as so-called "hardened" data (with the data that does not need to be so written then being "soft" data). This could be done, e.g., by firmware in the storage subsystem controller. When a power interruption is detected, the data marked as "hardened" would then be written to the nonvolatile memory.

In such an arrangement, the volatile memory will contain some data that is "hardened", i.e. to be preserved using the temporary power supply when a power failure or interruption occurs, and other data that is "soft", i.e. that will be lost when a power failure or interruption occurs.

In a particularly preferred embodiment, the storage system of the present invention includes means for setting and controlling the amount of data that can be hardened (i.e. that can be denoted as to be written to the nonvolatile memory using the temporary power supply in the event of a power failure or interruption). The system then preferably operates such that up to the set amount of data (but no more) in the volatile memory can be "hardened".

In a particularly preferred such embodiment, the amount of data in the volatile memory that is permitted to be hardened is set equal to the amount of data that it is determined can be written to the nonvolatile memory using the temporary power supply as discussed above (i.e. is determined based on the state of the temporary power supply that will be used to write that data to the nonvolatile memory in the event of a power supply failure or interruption). This will ensure that only so much data in the volatile memory as can at the time safely be transferred to the nonvolatile memory using the temporary power supply is allowed to be "hardened", (i.e. denoted as to be preserved in the event of a (main) power supply failure or interruption).

Such an arrangement again facilitates the storage subsystem returning to normal operation and use of the volatile memory after a power supply interruption before the temporary power supply, e.g. battery, is fully recharged, since by preventing more data than can be safely transferred to the nonvolatile memory using the temporary power supply from being treated as "hardened" data in the volatile memory, the possibility of data that clients of the storage system would assume had been preserved being lost in the event of another power supply interruption is reduced and even eliminated.

It is accordingly believed that this arrangement is new and advantageous in its own right, and further that its inclusion in a computer system is likewise new and advantageous.

Furthermore, the present invention includes means for denoting data stored in the volatile memory as being data that should be written to the nonvolatile memory using power supplied by the temporary power supply in the event of a power supply interruption, as well as means for determining the amount of data stored in the volatile memory that can be denoted as being data that should be written to the nonvolatile memory using power supplied by the temporary power supply in the event of a power supply interruption on the basis of the determined state of the temporary power supply.

According to another aspect of the present invention, there is provided a method of operating a data storage subsystem comprising a volatile memory, a nonvolatile memory, and a temporary power supply for temporarily supplying power to the system in the event of a power supply interruption. Steps in the method include determining an amount of data that can be stored in the volatile memory and denoted as being data that should be written to the nonvolatile memory using power supplied by the temporary power supply in the event of a power supply interruption on the basis of the state of the temporary power supply.

As will be appreciated by those skilled in the art, these arrangements and aspects of the present invention can include any one or more or all of the preferred features of the present invention described herein.

It will be appreciated that in these arrangements, where a power interruption has occurred and data from the volatile memory has accordingly been written to the nonvolatile memory using the temporary power supply, then the data transfer capacity of the temporary power supply will be reduced as compared to its previous value. In that case, the amount of data in the volatile memory that the system is currently permitting to be hardened may exceed the current data transfer capacity of the temporary power supply.

The Applicants have recognised that in this situation, if the "hardened" data stored in the volatile memory were to be changed in any way, then there would be a risk that the changed "hardened" data would be lost if another power interruption then occurs while the stored "hardened" data exceeds the data transfer capacity of the temporary power supply, since there would be insufficient power to dump all of the changes to the nonvolatile memory. (However, the original dumped hardened data is still protected, since a copy of it is still stored in the nonvolatile memory.)

However, once the amount of stored hardened data is less than or equal to the amount of such data that can be safely protected by the temporary power supply, then changes to the hardened data in the volatile memory can be safely permitted. The Applicants have further recognised that this state can be reached more quickly by existing users of hardened data "softening" their existing hardened data so as to reduce the amount of such data in the volatile memory.

It should be appreciated in this regard, that the "users" of hardened data in storage subsystems of the type of the present invention will be the "components" of the storage subsystem firmware that implement the basic data storage functions, such as fast-write caching, RAID5 APU or copy services. For example, data storage subsystems of the type that the present invention is applicable to may typically contain firmware client components in the form of a number of independent software layers performing, e.g., copy services, caching and RAID storage, each of which may need to use hardenable memory. Such firmware components can be viewed as client components of the storage subsystem (with the persistent memory management components of the storage subsystem firmware accordingly being "server components").

It is these firmware client components of the storage subsystem that actually harden and soften data and use hardenable data for their operations. This should be contrasted with external "clients" of the storage subsystem that will make input/output requests to the storage subsystem but will not themselves directly control or use hardened data (rather the control and use of hardened data will be decided and done by the firmware client components of the storage subsystem as they implement the input/output requests of the external client applications of the storage subsystem, independently of the external client applications).

Thus, in a particularly preferred embodiment, at least after a data "dump" has occurred, the current amount of "hardened" data in the volatile memory is compared with the determined currently permitted amount of hardened data, and where the current amount of hardened data exceeds the permitted amount, the firmware client components of the storage subsystem that use hardened data are instructed or controlled to "soften" their hardened data (i.e. to no longer denote it as data that should be written to the nonvolatile memory in the event of a power failure or interruption) until the amount of stored hardened data is less than or equal to the currently permitted amount of hardened data.

Most preferably, normal use of hardened data in the storage subsystem is suspended and not permitted until the amount of hardened data in the volatile memory is less than or equal to the determined currently permitted amount of hardened data, at which point normal operation and use of hardened data in the storage subsystem (albeit potentially with a smaller overall capacity for hardened data in the volatile memory) can be (and is) resumed. Then, as the temporary power supply's capacity increases (e.g. as the battery recharges), the amount of permitted hardened data can be increased until the maximum permitted amount is again reached.

Preferably, the storage subsystem is placed in a "read-only" state for hardened data (i.e. such that such data can only be read from the volatile memory, and no new hardened data can be written), until the amount of hardened data is below the determined permitted amount, at which point normal "read/write" operation for hardened data (and in particular the ability to write hardened data to the volatile memory) is restored.

This form of operation is advantageous because normal system operation can be resumed after a short period of data "softening" (which may typically take only a few seconds) rather than having to wait for the temporary power supply to be fully restored, and yet there is still a reduced or no risk that apparently "hardened" data will be lost.

In another embodiment of the present invention, the inventive apparatus includes means for setting a permitted amount of data stored in the volatile memory that can be denoted as being data that should be written to the nonvolatile memory using power supplied by the temporary power supply in the event of a power supply interruption on the basis of the determined state of the temporary power supply, means for comparing the amount of data stored in the volatile memory that is denoted as being data that should be written to the nonvolatile memory using power supplied by the temporary power supply in the event of a power supply interruption with the set permitted amount of such data, and means for, where the amount of stored data that is denoted as being data that should be written to the nonvolatile memory using power supplied by the temporary power supply in the event of a power supply interruption is found to exceed the permitted amount of such data that has been set, instructing a firmware client component of the storage subsystem to reduce the amount of data they have denoted in the volatile memory as being data that should be written to the nonvolatile memory using power supplied by the temporary power supply in the event of a power supply interruption.

According to another aspect of the present invention, there is provided a method of operating a data storage subsystem which comprises a volatile memory, a nonvolatile memory, and a power supply for temporarily supplying power to the storage subsystem in the event of a power supply interruption and in which data stored in the volatile memory can be denoted as being data that should be written to the nonvolatile memory using power supplied by the temporary power supply in the event of a power supply interruption. The method includes the step of determining a permitted amount of data stored in the volatile memory that can be denoted as being data that should be written to the nonvolatile memory using power supplied by the temporary power supply in the event of a power supply interruption on the basis of a determined state of the temporary power supply. The amount of data stored in the volatile memory that is denoted as being data that should be written to the non-volatile memory is compared to a determined amount of such data that can technically be stored, according to the amount of battery power available. If the amount of stored data denoted as being data that should be written to the nonvolatile memory using power supplied by the temporary power supply in the event of a power supply interruption is found to exceed the determined permitted amount of such data, then a firmware client component of the storage subsystem is instructed to reduce the amount of data denoted in the volatile memory as being data that should be written to the nonvolatile memory using power supplied by the temporary power supply in the event of a power supply interruption.

If the amount of stored data that is denoted as being data that should be written to the nonvolatile memory using power supplied by the temporary power supply in the event of a power supply interruption is found to exceed the determined permitted amount of such data, the writing of any new data in the volatile memory that is denoted as being data that should be written to the nonvolatile memory is prevented, while the amount of data in the volatile memory that is denoted as being data that should be written to the nonvolatile memory using power supplied by the temporary power supply in the event of a power supply interruption exceeds the permitted amount of such data.

These aspects and arrangements of the invention can again include any one or more or all of the preferred and optional features of the present invention described herein.

The Applicants have further recognised that in situations where, for example, the amount of volatile memory that can be "hardened" is limited as discussed above, and particularly in circumstances where the permitted hardened memory capacity has been reduced such that existing hardened memory must be "softened", then there may need to be some form of selection as to which data is to be hardened and/or softened, for example, where it would ideally be desirable for more than the permitted amount of data to be hardened, or where some existing hardened memory has to be softened to allow normal storage subsystem operation to resume. This situation could be exacerbated where there are, for example, plural firmware client components of the storage subsystem that can use or are using the storage subsystem, each with conflicting demands for "hardened" memory capacity. Such firmware client components of the storage subsystem could, e.g., be, as discussed above, software "layers" that are part of the firmware of, e.g., the storage subsystem adapter or controller.

While it would be possible simply to allocate the available amount of "hardenable" (persistent) memory (i.e. data that can be hardened) on an, e.g., first come, first served basis, or to, e.g., statically divide the entire memory pool between the storage subsystem client components, in fixed proportions, the Applicants have recognised that such schemes may not permit the most efficient use of the available hardenable memory, and/or the fastest return to normal operation where existing hardened data needs to be softened for that to take place.

For example, data storage subsystems of the type that the present invention is applicable to may typically contain, as discussed above, firmware client components in the form of a number of independent software layers performing, e.g., copy services, caching and RAID storage, each of which may need to use hardenable memory and which without access to sufficient hardenable memory (e.g. sufficient hardenable memory to process one input/output request) may become deadlocked. Furthermore, these software layers are usually effectively stacked one on top of each other, with each layer effectively operating to write to the layer or layers below (e.g. a fast write cache will cache data for and write that data to, a RAID array below it). This can mean that if the lower layers cannot process data, e.g., because they do not have access to sufficient hardenable memory, the layers above them will also become deadlocked.

Thus the Applicants have recognised that simply allocating the available hardenable data capacity in the volatile memory equally between the storage subsystem's client components (e.g. software layers) or on a first come, first served basis may not, e.g., permit the most efficient softening of existing hardened data.

It is accordingly preferred that the available hardened data capacity (and/or, e.g., accordingly the requirement to soften existing hardened data when that is necessary) is allocated dynamically to firmware client components of the storage subsystem. Most preferably the storage in the volatile memory of hardened data is controlled based on the nature of the data to be stored and/or the nature of the client component requesting storage of the data and/or use of the hardenable data capacity in the volatile memory.

The control of the storage of hardened data in the volatile memory preferably relates to permitting (or not) the storage of such data. Most preferably, it relates to allocating given proportions or amounts of available hardenable data capacity to the respective data types, client components, etc. Thus in a particularly preferred embodiment, each firmware client component of the storage subsystem will have its own, individual (variable) hardenable data allocation (capacity), which it will be controlled, as discussed above, from exceeding.

In a particularly preferred such embodiment, access to the hardenable memory capacity in the volatile memory is based on priority allocations given to the firmware client components of the storage subsystem. Most preferably, in such an embodiment, different priority levels for access to hardened memory are allocated to, e.g., different types of data and/or different firmware client components of the storage subsystem, and the available amount of hardenable memory is then allocated, and/or the softening of existing hardened memory is then controlled, on the basis of the priority allocations.

The way that firmware client components of the storage subsystem are prioritised for hardened data capacity use and allocation can be selected as desired. In a particularly preferred embodiment, firmware client components of the storage subsystem that require hardenable memory to ensure data integrity are preferably given a higher priority than client components that only require hardenable memory for increased performance, which client components are in turn preferably given a higher priority than any client components for which hardenable memory is neither required for data integrity nor permits increased performance.

It is particularly preferred for the access to and allocation of the available hardenable memory (e.g. priority allocations) to also or instead be based on the dependencies between firmware client components of the storage subsystem for processing their, e.g., input/output requests, and/or (accordingly) when softening their hardened data. Thus, for example, if a first firmware client component of the storage subsystem is dependent on a second client component to process its write (or read) operations (which operations may, e.g., need to be completed to allow the first client component to successfully soften its existing hardened data), the second client component is preferably allocated a higher priority for the hardenable memory allocation, as that may then, e.g., permit the first client component to soften its hardened data more quickly. As discussed above, such a situation can typically arise where upper software layers in a client component "stack" are dependent on the ability of lower layers in the client component stack to process input/output requests to be able themselves to soften their hardened data.

It is accordingly preferred for these "lower layer" client components on which other client components depend to be allocated a higher priority for hardenable memory allocation, so as to allow them to complete their I/O requests faster and accordingly permit client component layers above them to soften their hardened data. Thus, preferably, the lower layers in the client component "stack" are given preferential access to the available hardenable memory, particularly where it is necessary to soften existing hardened data.

Thus, in a particularly preferred embodiment, the storage in the volatile memory of hardened data by different firmware client components of the storage subsystem is controlled on the basis of the dependency of at least one of the client components on another client component or components for processing its input/output requests to the storage system.

Most preferably, the access (or otherwise) to hardenable data capacity by a client component (and preferably by all of the client components), and/or the amount of available hardenable data capacity allocated to a client component (and preferably to each of the client component), is based on the relevant client component dependencies of the (or each) client component. Most preferably, the storage of hardened data in the volatile memory is controlled based on the dependencies of more than one (and preferably of all) of the client components on another client component or components (and preferably on all of the other client components) for processing their input/output requests to the storage subsystem.

In a particularly preferred such embodiment, the available hardenable (persistent) memory is assigned in a priority order that best enables the storage subsystem to soften hardened data when necessary, as this enables the amount of hardened data to be reduced to a quantity that matches or is below the available hardenable memory as quickly as possible (and accordingly the system to be returned, as discussed above, to normal operation as quickly as possible). Thus, in a particularly preferred embodiment, the storage in the volatile memory of hardened data by different firmware client components of the storage subsystem is controlled on the basis of the ability of a or more than one of the client components to reduce the amount of hardened data that it or they have stored in the volatile memory.

In a particularly preferred embodiment, the available hardenable memory is allocated firstly to client components that need persistent memory to ensure data integrity, and then once those client components' needs have been satisfied, to client components on which other client components are dependent to be able to soften their existing hardened data. Then, as the available pool of hardenable memory increases, any hardenable memory capacity not required for these client components is allocated to the remaining client components in an order which enables increased (and preferably best) performance of the system.

In a particularly preferred embodiment, when the permitted amount of hardened data that can be stored in the volatile memory is at its maximum value (e.g. when the temporary power supply is fully charged), the available hardened data capacity is divided among the firmware client components of the storage subsystem firmware according to fixed, preferably predetermined, proportions, but when the amount of hardened data capacity is less than the maximum amount, the available hardened data capacity is allocated dynamically using a priority scheme, as discussed above.

The present invention can be used in any data storage system where it is desired to, e.g., make the contents of a volatile memory "persistent" across power interruptions and failures, and/or in which the contents of a volatile memory can be made persistent across power interruptions and failures. It is therefore applicable to storage subsystems in general, and to, for example, applications such as write caching, RAID5 atomic parity update and copy services.

The apparatus of the present invention can be implemented in the storage subsystem as desired. In a particularly preferred embodiment it is in the form of a storage adapter for a storage subsystem, which comprises, e.g., the volatile and nonvolatile memories, the temporary power supply, and a processor for carrying out the various functions described herein.

In operation of a data storage subsystem in accordance with the present invention, when the main power supply is operating normally, data will be stored in the volatile memory and then, e.g., written elsewhere, as is known in the art. In the event of a power failure, the system will switch to its temporary power supply and contents of the volatile memory will be written to the nonvolatile memory to preserve them. When this has been completed, the temporary power supply will be turned off. When the main system power returns, the "preserved" data from the nonvolatile memory will be read back to the volatile memory and the operations to write it "properly" to the nonvolatile memory continued and completed. The temporary power supply will (where appropriate) also be recharged. This is basically similar to the operation of prior art data storage subsystems.

However, in the present invention, "normal" operation of the storage subsystem and in particular normal use of the volatile memory can be and preferably is resumed before the temporary power supply has been fully recharged. For example, in accordance with the preferred embodiments of the invention discussed above, once a power supply interruption has occurred, firmware client components of the storage subsystem are instructed to soften their existing hardened data in the volatile memory until the amount of hardened data falls below the amount of hardened data that can be supported by the temporary power supply in its current state, at which point normal operation of the system can be resumed (albeit with a reduced available capacity for hardened data in the volatile memory).

The methods in accordance with the present invention may be implemented at least partially using software e.g. computer programs. It will thus be seen that when viewed from further aspects the present invention provides computer software specifically adapted to carry out the methods hereinabove described when installed on data processing means, and a computer program element comprising computer software code portions for performing the methods hereinabove described when the program element is run on data processing means. The invention also extends to a computer software carrier comprising such software which when used to operate a data storage subsystem or an apparatus for controlling such a system comprising data processing means causes in conjunction with said data processing means said system or apparatus to carry out the steps of the method of the present invention. Such a computer software carrier could be a physical storage medium such as a ROM chip, CD ROM or disk, or could be a signal such as an electronic signal over wires, an optical signal or a radio signal such as to a satellite or the like.

It will further be appreciated that not all steps of the method of the invention need be carried out by computer software and thus from a further broad aspect the present invention provides computer software and such software installed on a computer software carrier for carrying out at least one of the steps of the methods set out hereinabove.

The present invention may accordingly suitably be embodied as a computer program product for use with a computer system. Such an implementation may comprise a series of computer readable instructions either fixed on a tangible medium, such as a computer readable medium, for example, diskette, CDROM, ROM, or hard disk, or transmittable to a computer system, via a modem or other interface device, over either a tangible medium, including but not limited to optical or analogue communications lines, or intangibly using wireless techniques, including but not limited to microwave, infrared or other transmission techniques. The series of computer readable instructions embodies all or part of the functionality previously described herein.

Those skilled in the art will appreciate that such computer readable instructions can be written in a number of programming languages for use with many computer architectures or operating systems. Further, such instructions may be stored using any memory technology, present or future, including but not limited to, semiconductor, magnetic, or optical, or transmitted using any communications technology, present or future, including but not limited to optical, infrared, or microwave. It is contemplated that such a computer program product may be distributed as a removable medium with accompanying printed or electronic documentation, for example, shrink wrapped software, preloaded with a computer system, for example, on a system ROM or fixed disk, or distributed from a server or electronic bulletin board over a network, for example, the Internet or World Wide Web.

With reference now to the figures, and particularly to FIG. 1 shows schematically the layout of a storage adapter 1 for use in a data storage subsystem in accordance with an embodiment of the present invention. The storage adapter 1 is basically operable to interface between a host microprocessor system 2 and a main nonvolatile memory disk array 3 and can, e.g., be in the form of an adapter "card", as is known in the art. The storage adapter 1 operates to input and output data from the host system 2 to the hard disk array 3.

The storage adapter 1 includes a controlling processor 4, a volatile memory 5 (which in this embodiment is in the form of an SDRAM (Synchronous Dynamic Random Access Memory), although other forms of volatile memory could be used, if desired), and a nonvolatile memory "dump device" 6 in the form of a flash memory, such as a compact flash device. (Other forms of nonvolatile memory, such as a "micro" disk drive, could be used if desired. The basic requirement for the nonvolatile memory 6 is that it should be a compact and low power device that can be run using power supplied by a temporary power supply of the storage adapter (see below)).

The storage adapter 1 also includes a battery charger 7, a bridge 8 for interfacing between, inter alia, the processor 4, volatile memory 5, nonvolatile memory 6, and a PCI bridge and memory controller unit 9 that interfaces between and connects the host system 2 and the hard disk array 3.

The storage adapter 1 includes a temporary power supply in the form of a battery 10. Other forms of temporary power supply would be possible, if desired. This battery power supply 10 is used, as will be discussed further below, to provide sufficient power to the storage adapter 1 to allow data from the volatile memory 5 to be written to the nonvolatile memory 6 of the storage adapter under the control of the processor 4 in the event of an interruption or failure in the main power supply to the storage adapter 1, i.e. to preserve data stored in the volatile memory in that event. The battery 10 should accordingly have sufficient capacity to provide power for this purpose, but it should be noted that it is not necessary for the battery 10 to, and indeed it is preferred for this temporary power supply not to, provide power for operating and writing data to the disk array 3 of the storage subsystem.

In normal operation, the storage adapter 1 operates to receive input and output requests from the host system 2, and to accordingly store data in or retrieve data from the disk array 3 for the host system 2. The actual data storage and retrieval is implemented as is known in the art, by firmware "client" components of the storage adapter 1, that implement functions on the basic storage, such as fast-write caching RAID5 APU and copy services in order to carry out the input and output requests from the host system 2. As part of this process, as is known in the art, the storage adapter 1 firmware may temporarily store data received from the host system 2 in the volatile memory 5, before that data is transferred to the disk array 3. As discussed above, in the event that there should be a power supply failure to the storage adapter 1 and hence volatile memory 5, the data stored in the volatile memory 5 would be lost. This can be disadvantageous, particularly where the storage adapter 1 is, for example, carrying out "fast write caching".

The storage adapter 1 accordingly includes, as discussed above, a temporary power supply in the form of a battery 10, which can be used to write data from the volatile memory 5 to the nonvolatile memory dump device 6 in the event of a main power supply failure, so as to preserve that data. To facilitate this, the storage adapter 1 includes hardware to detect the loss of system power and then switch to the temporary power supply of battery 10 whilst maintaining power to the necessary components of the storage adapter 1.

The data in the volatile memory 5 which must survive (i.e. persist) across a main power supply interruption or failure is marked as "hardened" by the adapter firmware. Then, when a power supply interruption is detected, the adapter 1 switches to the temporary power supply of battery 10, and dumps the parts of the volatile memory 5 which have been "hardened" to the nonvolatile dump device 6. When the data "dump" has been completed, the temporary power supply is turned off. When system power returns, the data from the dump device 6 is read back into the volatile memory 5 and normal operation resumed. The discharged temporary power supply of battery 10 is then recharged using the battery charger 7. It should be noted here that a data "dump" in these circumstances will typically only take two or three minutes, whereas to fully recharge the battery 10 may take of the order of one hour.

Data that is marked as "hardened" in the volatile memory 5 can also be "softened" by the adapter firmware, for example, when that data is no longer required to persist over power outages.

The processor 4 of the storage adapter 1 also includes, in accordance with the present invention, means for determining the quantity of data in the volatile memory 5 that can be protected by the temporary power supply 10 at any given time, and accordingly to control the amount of data in the volatile memory 5 that can be stored as "hardened" data.

The processor 4 does this by first determining the state of the temporary power supply 10. It does this using a predetermined table of the charging and discharging characteristics of the battery 10 and by timing how long the battery 10 is charged or discharged for. The state of the battery 10 is updated every few minutes, and the current state of charge is recorded in a nonvolatile storage device in the form of an EEPROM mounted on the battery 10 (so that this information also survives any main power supply interruption).

The processor 4 then uses the current state of charge of the battery 10 to determine the amount of hardened data that can be "dumped" to the nonvolatile dump device 6 using the temporary power supply battery 10 in its current state. The relationship between the current state of the battery 10 and the amount of hardened data that can be dumped to the nonvolatile dump device 6 is again predetermined, using, for example, the known characteristics and power usage requirements for writing to the nonvolatile memory dump device 6. It could be based on, e.g., the amount of time that the battery 10 can power the adapter for and the amount of data that can be written to the nonvolatile memory in that time.

Where the nonvolatile dump device 6 is a flash memory device, as in the present embodiment, there will typically be a linear relationship between the state of charge of the battery 10 and the amount of data that can be dumped. More sophisticated determinations may be necessary in the case of, e.g., micro disk drives, since in that case the write rate to the micro disk drive will not be constant and so the relationship between the state of charge and the amount of data that can be dumped may not be linear.

As part of its calculation, the processor 4 also determines a "safety" margin, based on the known accuracy of the estimation of the time the battery 10 can power the storage adapter 4 for, and the accuracy of the estimation of the amount of data that can be dumped in that time.

In this way, the processor 4 determines the amount of data that can safely be stored in the volatile memory 5 as hardened data at any given time.

The processor 4 then uses the determined amount of data that can be safely hardened in the volatile memory 5 to control the hardening of data in that memory. The determined permitted amount of hardened data will be referred to herein as the "guarantee", and the processor 4 operates so as to try to maintain the amount of hardened data in the volatile memory 5 below this guarantee. Thus, for example, since immediately after a power supply failure, the quantity of hardened data in the volatile memory 5 will exceed the amount of hardened data which can be protected by the battery 10 (since it will have been discharged), then the processor 4 will instruct firmware client components of the storage subsystem using hardened data in the volatile memory 5 to soften their data until the quantity of hardened data is less than the current "guarantee", at which point the client components are permitted to use the smaller quantity of available hardened memory as usual. As the battery 10 recharges, the guarantee level is raised accordingly, thereby allowing more data to be hardened.

Figure 2:
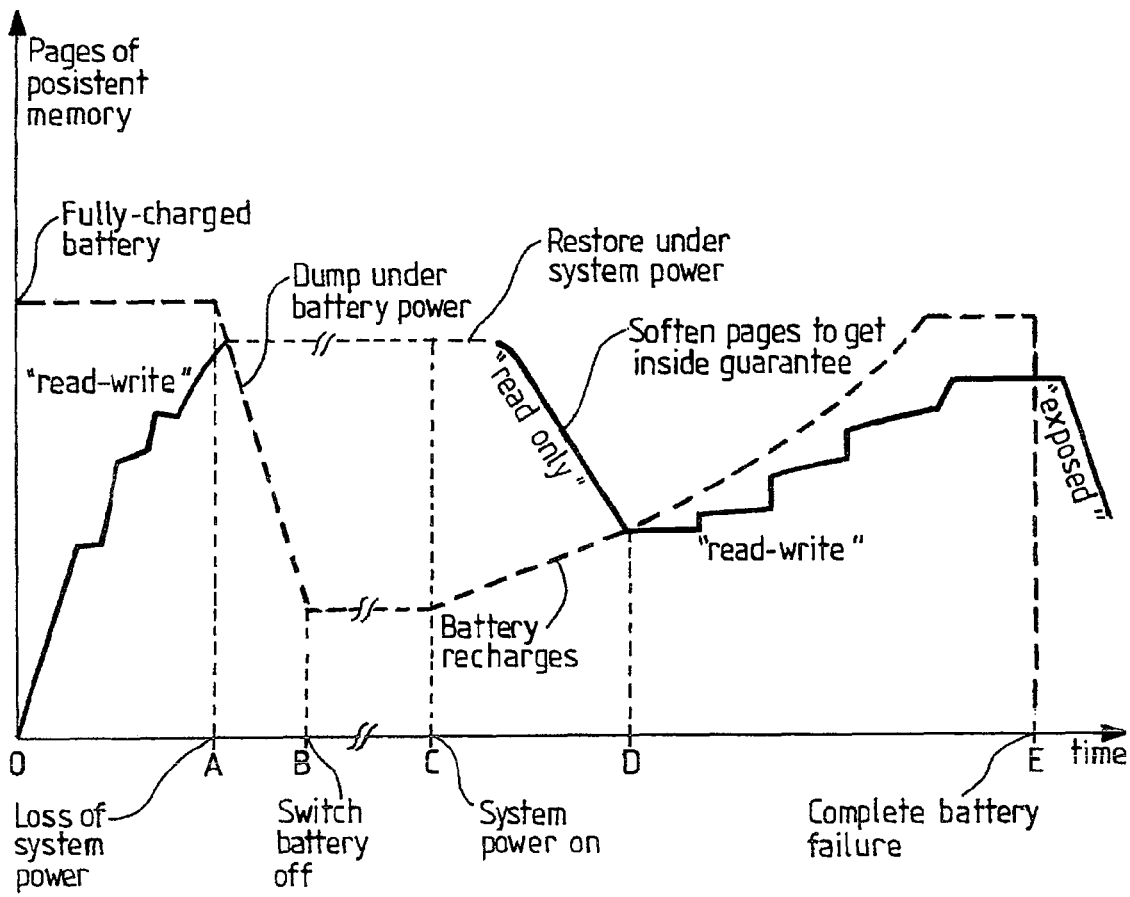
FIG. 2 is a graph illustrating the operation of the storage adapter of FIG. 1 in accordance with the present invention.

FIG. 2 illustrates the operation of the storage adapter 1 in this manner. FIG. 2 is a graph showing the amount of hardened data (in terms of the number of pages of persistent or hardened memory) along the y-axis against time along the x-axis. The solid line in FIG. 2 is the actual number of hardened pages in the volatile memory 5 at the time indicated. The dashed line is the number of memory pages that the system can guarantee to preserve, given the charge in the battery, at the time indicated (which guarantee amount is, as discussed above, determined based on a conservative estimate of the charge in the battery and the data that can be written to the dump device 6 using that charge.)

In the example shown in FIG. 2, the system starts at time zero in a state with the battery 10 fully charged. The number of memory pages that the system can guarantee to preserve is therefore at its maximum level, and the system is accordingly placed in a "read/write" state, whereby firmware client components of the subsystem can harden and soften their data in the volatile memory 5 as they like subject to the guaranteed level of hardened data not being exceeded.

At time A, a loss of system power occurs, and accordingly the storage adapter 1 operates to dump the hardened data stored in the volatile memory 5 to the nonvolatile dump device 6 using the battery 10. Once the data dump finishes, the battery 10 is switched off at time B. The nonvolatile memory 6 is marked as being "valid", indicating that it now stores a copy of data that is to be preserved and has not yet safely been restored.

A consequence of this data dump under battery power is that the remaining power capacity of the battery 10 is reduced, and as such the number of memory pages that can be protected by the battery (i.e. the guarantee) is reduced, as shown by the dashed line in FIG. 2. In this example, the data dump took place when there was almost the maximum amount of hardened pages in the volatile memory 5, and so the data dump accordingly took a significant amount of charge in the battery and so the guarantee is considerably reduced (although other situations would, of course, be possible).

When system power returns at time C, the hardened memory pages dumped to the dump device are copied back to the volatile memory 5 (i.e. restored). However, as shown in FIG. 2, the number of hardened pages will then exceed the guarantee. The volatile memory 5 is accordingly placed in a "read only" state for hardened data, such that the storage subsystem's firmware client components cannot harden new pages or modify the content of the current hardened pages. However, firmware client components of the subsystem can (and indeed are instructed to) soften memory pages to reduce their hardened pages towards the new guarantee.

The system is placed in a "read only" state in these circumstances because if there is another power failure whilst the number of hardened pages exceeds the guarantee, then the original hardened pages can still be restored from the dump device (since they are still stored there), and so preventing new "hardened" data being written to the volatile memory (which new data could then be lost if there was another power supply failure, as all of the hardened data could not be dumped again (as the temporary power supply would have insufficient capacity to do so)) ensures that any data marked as hardened can still safely be restored in the event of a second power supply failure It will be appreciated from this that another power failure in the "read only" state results in the same data as was previously restored being restored to the volatile memory 5 from the dump device 6.

As shown in FIG. 2, as the battery recharges, the guarantee increases, and once the guarantee has again risen above the number of hardened pages in the volatile memory 5, the system can return to the read/write state for hardened data, albeit with a reduced quantity of hardenable data, as shown at time D in FIG. 2. At this point the nonvolatile memory 6 can also be marked as "invalid", indicating that its contents no longer need to be preserved and so can be safely written over.

It should be noted here that the "read/write" state of the volatile memory 5 is returned to after a few seconds of data softening, rather than the system having to wait for the battery 10 fully to recharge (which could, e.g., take an hour or more). Thus, the present invention permits some hardenable system memory to be available very quickly after a discharge due to a data dump.

FIG. 2 finally illustrates the unusual situation of a complete battery failure at time E. In this case, the guarantee immediately drops because of the battery failure. Such a drop in the guarantee could also occur, if there is, e.g., a re-estimation of the battery's capacity due to aging. In this situation, because there is not already a copy of the hardened data stored on the dump device 6 (unlike in the situation where a power supply failure has occurred), a main power failure would cause data loss (since the battery can no longer protect all the hardened data), and so the system is "exposed", and client components must soften their hardened data immediately.

Figure 3:
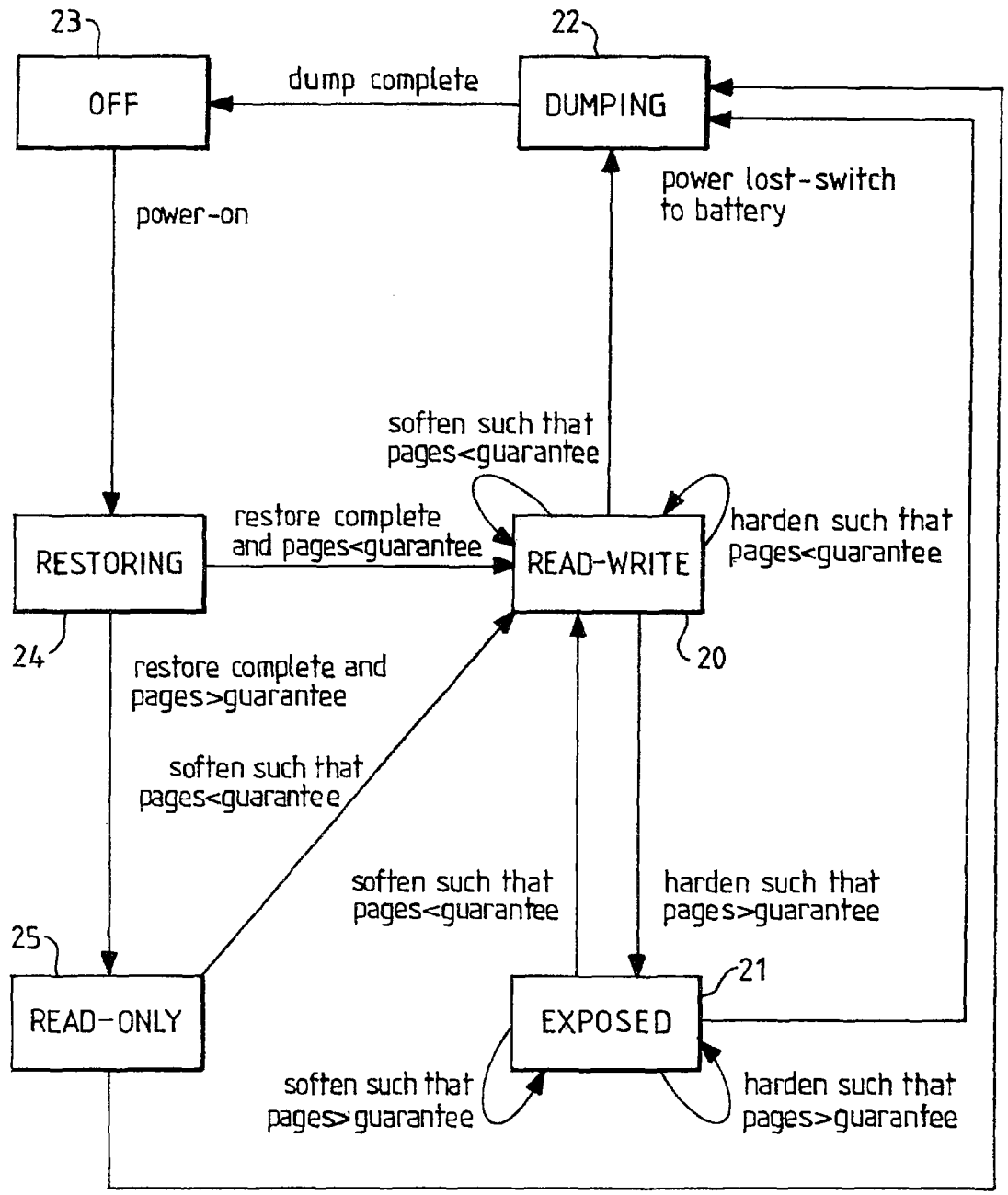
FIG. 3 is a state diagram showing the possible states of the storage adapter shown in FIG. 1 when operating in accordance with the present invention.

FIG. 3 is a state diagram that shows schematically the various possible states of the storage adapter 1. Thus, for example, when the storage adapter is in the read/write state 20, it is permitted to harden and soften memory pages so long as the number of hardened pages remains below the guarantee. Should the pages be hardened such that the number of hardened pages exceeds the guarantee, then the system enters the exposed state 21, and will remain in that state until such time as sufficient pages have been softened that the number of hardened pages is less than the guarantee, in which case the system can return to the read/write state 20.

When main power is lost, the system switches to the "dumping" state 22, where hardened data is dumped from the volatile memory 5 to the nonvolatile memory 6 using the battery supply. Once a dump is complete, the system moves to the off state 23, until the main power supply is restored, at which point the system moves to the restoring state 24, where the preserved data stored in the dump device 6 is restored to the volatile memory 5.

Once the restore is complete and the number of hardened pages is less than the guarantee, then the system can return to the read/write state 20. On the other hand, if once the restore is complete, the number of hardened pages exceeds the guarantee, then the system enters the read-only state 25, and client components soften their pages until the number of hardened pages is less than the guarantee, at which point the system can return to the read/write state 20.

It will be appreciated that in the operation of the storage adapter in accordance with the present embodiment as described above, there will be times, for example when the system is in the "read-only" state, where the amount of hardened data exceeds the amount of such data that can be protected, and that accordingly the firmware client components of the subsystem will need to soften their hardened data to reduce the amount of hardened data down to the new, lower guarantee.

Where there is only a single user of the hardened memory, then this may not present too much difficulty. However, where there are a number of conflicting client components using the hardened memory, then while it would be possible simply to allocate the reduced available amount of hardened memory in, for example, fixed proportions between different users, the Applicants have, as discussed above, recognised that that may be not always be the most desirable arrangement. A preferred embodiment for allocating the available hardenable memory that is in accordance with the present invention will therefore now be described.

It will be assumed for the purposes of this embodiment, that the storage subsystem contains a number of independent software layers that are part of the storage subsystem firmware, such as copy services, caching and RAID storage, each of which may need to use hardenable memory and each of which can be considered to be firmware "client components" of the storage subsystem. As is known in the art, each of these software layers can be considered to be effectively stacked one on top of each other, with each layer effectively operating to write to the layer or layers below. Each layer will also typically need access to sufficient hardenable memory to, e.g., process one input/output request or risk becoming deadlocked (which can then, e.g., deadlock the layers above it as well).

To reduce the risk of such deadlocks occurring, the available hardened memory capacity is in this embodiment divided between these firmware client components of the storage subsystem as follows. Firstly, when there is a full quota of hardenable memory capacity (i.e. the battery 10 is fully charged), then each client component of the subsystem is allocated a predetermined static quota of hardenable memory capacity for its use. However, when the available amount of hardenable memory capacity is restricted (i.e. less than the maximum value), then the various client components have their requirements satisfied in a predetermined priority order.

The priority order basically is arranged so as firstly to provide client components who require hardenable memory to ensure data integrity with their hardenable memory capacity requirement first. Once those client components have their hardened memory capacity requirements satisfied, then those client components that require hardenable memory for increased performance are allocated any "spare" hardenable memory in an order which enables the best performance.

The priority order for the allocation of available hardenable memory is also based on the dependencies between client components when softening their hardenable memory. Thus, for example, where firmware client components of the storage subsystem are dependent upon the ability of other client components to process their input/output requests before they themselves can process their input/output requests, the available hardenable memory is first allocated to those client components who if given access to that hardenable memory will then allow other client components to soften their own hardenable memory, as this accelerates the overall softening of the "excess" hardenable memory. Thus, for example, if client component X is dependent on client component Y to successfully soften its persistent memory, then client component Y is given the higher priority for the available hardenable memory.

Thus in this embodiment, the lower layers in the "client" component stack are given preferential access to the hardenable memory, so as to reduce the risk of a deadlock situation where the bottom layer in the stack does not have the ability to process writes because it cannot modify hardenable memory (because its quantity of hardened memory exceeds its guarantee) whilst the upper layers do have some or all of the limited hardenable memory guarantee, but still cannot perform input/output operations because they need the lower layers to process their input/output operations first.

Thus, considering the above examples of firmware client components of the data storage subsystem of cache, flash copy and RAID5 APU, of these client components, RAID5 APU requires at least some hardenable memory before it can operate, flash copy will perform slowly without hardenable memory, and cache does not require hardenable memory. Thus, these client components are in the present embodiment placed in the following priority order for hardenable memory (with the highest priority first): RAID5 APU, flash copy and cache.

Thus, in this embodiment, when all the client components that require hardenable memory to ensure data integrity have had their requirements satisfied, the dependent client components can then start using them to help soften their hardenable memory, and as the hardenable memory pool increases, any remaining dependent client components who require hardenable memory for increased performance can be allocated increasing quantities of hardenable memory in an order which enables the best performance.

The effect of this is that the available hardenable memory pool is assigned in a priority order which best enables the users of the hardenable memory to soften the hardenable memory more quickly, and accordingly reduce the overall quantity of hardened memory more quickly towards the available guaranteed amount of hardened memory that the system can support. This facilitates, for example, the system returning to a "read/write state" for hardened data from a "read-only" state as quickly as possible, by allocating the available hardened memory on an appropriate priority basis.

The present invention has application wherever persistent (hardenable) memory may be required, such as in most storage subsystems and in applications such as write caching, RAID5 atomic parity updating and copy services.

As can be seen from the above, the present invention addresses the problem of the temporary power supply not always being fully charged (e.g. immediately after a data dump), by using a variable quota for the amount of hardenable memory that is available to a software module that requires such memory. The present invention also avoids the need to wait until the temporary power supply of the storage adapter is fully recharged after a data dump before use of hardened memory can be begun again, but instead permits some hardenable memory to be available much more quickly after a data dump.

Furthermore, the present invention, in its preferred embodiments at least, essentially eliminates the possibility of loss of hardened customer data that may be stored in the volatile memory. This is achieved by operating the storage adapter such that even in the event of multiple power losses, the hardened data is always either in the volatile memory and protected by sufficient temporary power supply capacity, or on the nonvolatile dump device.

It should be understood that at least some aspects of the present invention may alternatively be implemented in a program product, preferably performing the functions of the present invention in an automatic manner based on pre-determined criteria as described, including relative logical relationships between and among logic areas. Programs defining functions on the present invention can be delivered to a data storage system or a computer system via a variety of signal-bearing media, which include, without limitation, non-writable storage media (e.g., CD-ROM), writable storage media (e.g., a floppy diskette, hard disk drive, read/write CD ROM, optical media), and communication media, such as computer and telephone networks including Ethernet. It should be understood, therefore in such signal-bearing media when carrying or encoding computer readable instructions that direct method functions in the present invention, represent alternative embodiments of the present invention. Further, it is understood that the present invention may be implemented by a system having means in the form of hardware, software, or a combination of software and hardware as described herein or their equivalent.

While the invention has been particularly shown and described with reference to a preferred embodiment, it will be understood by those skilled in the art that various changes in form and detail may be made therein without departing from the spirit and scope of the invention.

The invention claimed is:

1. An apparatus for use in a data storage subsystem comprising:
   a volatile memory;
   a nonvolatile memory;
   a temporary power supply;

processing logic that:
  detects an interruption in the power supply to the volatile memory;
  in the event of such detection, performs the steps of:
    determines an amount of stored power of the temporary power supply, wherein the amount of stored power is a relative amount of power greater than zero up to a larger amount of power;
    calculates an amount of data stored in the volatile memory that can be written to the nonvolatile memory before the amount of stored power of temporary power supply is depleted; and
    writes the calculated amount of data stored in the volatile memory to the nonvolatile memory using the amount of stored power supplied by the temporary power supply.

2. The apparatus of claim 1, wherein the temporary power supply is a rechargeable battery.

3. The apparatus of claim 1, the processing logic further comprising logic that:
  denotes data stored in the volatile memory as being data that should be written to the nonvolatile memory using power supplied by the temporary power supply in the event of a power interruption.

4. An apparatus for a data storage subsystem comprising:
a volatile memory;
a nonvolatile memory;
a temporary power supply for temporarily supplying power to the apparatus in the event of a main power supply interruption;
processing logic that:
  determines an amount of stored power of the temporary power supply, wherein the amount of stored power is a relative amount of power greater than zero up to a larger amount of power;
  denotes data stored in the volatile memory as being data that should be written to the nonvolatile memory using power supplied by the temporary power supply in the event of the main power supply interruption; and
  calculates a permitted amount of data that can be stored in the volatile memory and that can be denoted as being data that should be written to the nonvolatile memory using power supplied by the temporary power supply in the event of a power supply interruption on the basis of the determined state of the temporary power supply, wherein data that should be written is hardened data, wherein hardened data is data that has been predetermined to persist in the event of the main power supply interruption.

5. The apparatus of claim 4, the processing logic further comprising logic that:
  compares the amount of data stored in the volatile memory that is denoted as being data that should be written to the nonvolatile memory using power supplied by the temporary power supply in the event of a power supply interruption with the set permitted amount of such data.

6. The apparatus of claim 5, the processing logic further comprising logic that:
  when the amount of stored data that is denoted as being data that should be written to the nonvolatile memory using power supplied by the temporary power supply in the event of a power supply interruption is found to exceed the permitted amount of such data that has been set, instructs a firmware client component of the storage subsystem to reduce the amount of data it has denoted in the volatile memory as being data that should be written to the nonvolatile memory using power supplied by the temporary power supply in the event of a power supply interruption.

7. An apparatus for a data storage subsystem comprising:
a volatile memory;
a nonvolatile memory;
a power supply for temporarily supplying power to the apparatus in the event of a main power supply interruption;
processing logic that:
  determines an amount of stored power of the temporary power supply, wherein the amount of stored power is a relative amount of power greater than zero up to a larger amount of power;
  denotes data stored in the volatile memory as being data that should be written to the nonvolatile memory using power supplied by the temporary power supply in the event of the main power supply interruption;
  sets a permitted amount of data stored in the volatile memory that can be denoted as being data that should be written to the nonvolatile memory using power supplied by the temporary power supply in the event of a power supply interruption on the basis of the determined state of the temporary power supply;
  compares the amount of data stored in the volatile memory that is denoted as being data that should be written to the nonvolatile memory using power supplied by the temporary power supply in the event of a power supply interruption with the set permitted amount of such data;
  where the amount of stored data that is denoted as being data that should be written to the nonvolatile memory using power supplied by the temporary power supply in the event of a power supply interruption is found to exceed the permitted amount of such data that has been set, prevents the writing of any new data stored in the volatile memory that is denoted as being data that should be written to the nonvolatile memory using power supplied by the temporary power supply in the event of a power supply interruption, while the amount of data stored in the volatile memory that is denoted as being data that should be written to the nonvolatile memory using power supplied by the temporary power supply in the event of a power supply interruption exceeds the set permitted amount of such data, and wherein access to memory capacity for data that is denoted as being data that should be written to the nonvolatile memory using power supplied by the temporary power supply in the event of a power supply interruption is given preferentially to firmware client components of the storage subsystem that require such data storage to ensure data integrity;
  controls the storage in the volatile memory of data that is denoted as being data that should be written to the nonvolatile memory using power supplied by the temporary power supply in the event of a power supply interruption on the basis of the nature of the data being stored and/or the nature of the client component requesting storage of the data in the volatile memory; and
  allocates memory capacity for data that is denoted as being data that should be written to the nonvolatile memory using power supplied by the temporary power supply in the event of a power supply interruption on the basis of the nature of the data being stored and/or the nature of the client component requesting storage of the data in the volatile memory.

8. The apparatus of claim 7, the processing logic further comprising logic that:
controls the storage in the volatile memory of data that is denoted as being data that should be written to a nonvolatile memory using power supplied by the temporary power supply in the event of an interruption in the power supply to the volatile memory by different firmware client components of the storage subsystem on the basis of the dependency of at least one of the client components on another client component or components for processing its input/output requests to the storage subsystem.

9. The apparatus of claim 7, the processing logic further comprising logic that:
controls the storage in the volatile memory of data that is denoted as being data that should be written to a nonvolatile memory using power supplied by the temporary power supply in the event of an interruption in the power supply to the volatile memory by different firmware client components of the storage subsystem on the basis of the ability of one or more of the client components to reduce the amount of data that it or they have stored in the volatile memory that is denoted as being data that should be written to a nonvolatile memory using power supplied by the temporary power supply in the event of an interruption in the power supply to the volatile memory.

10. A method of operating a data storage subsystem comprising a volatile memory, a nonvolatile memory, and a temporary power supply for supplying temporary power to the storage subsystem after the interruption of the power supply to the subsystem, in which in the event of the detection of an interruption of the power supply to the volatile memory, data from the volatile memory is written to the nonvolatile memory using power supplied from the temporary power supply, the method comprising:
determining an amount of stored power of the temporary power supply, wherein the amount of stored power is a relative amount of power greater than zero up to a larger amount of power; and
calculating an amount of data stored in the volatile memory that can be written to the nonvolatile memory using the amount of stored power supplied by the temporary power supply on the basis of the determined state of the temporary power supply and
controlling the storage in the volatile memory of data that is denoted as being data that should be written to a nonvolatile memory using power supplied by the temporary power supply in the event of an interruption in the power supply to the volatile memory by different firmware client components of the storage subsystem on the basis of the ability of a or more than one of the client components to reduce the amount of data that it or they have stored in the volatile memory that is denoted as being data that should be written to a nonvolatile memory using power supplied by the temporary power supply in the event of an interruption in the power supply to the volatile memory.

11. A computer program product, residing on a computer usable storage medium, for use with operating a data storage subsystem comprising a volatile memory, a nonvolatile memory, and a temporary power supply, in which in the event of the detection of an interruption of the power supply to the volatile memory, data from the volatile memory is written to the nonvolatile memory using power supplied from the temporary power supply, the computer program product having a plurality of instructions embodied therein, wherein the plurality of instructions, when executed by a processing device, causes a data processing system to perform the following steps:
determine an amount of stored power of the temporary power supply, wherein the amount of stored power is a relative amount of power greater than zero up to a larger amount of power; and
calculate the amount of data stored in the volatile memory that can be written to the nonvolatile memory using power supplied by the temporary power supply on the basis of the determined state of the temporary power supply.

12. The computer program product of claim 11, the plurality of instructions further comprising instructions for enabling the data processing system to:
calculate a permitted amount of data that can be stored in the volatile memory and denoted as being data that should be written to the nonvolatile memory using power supplied by the temporary power supply in the event of a power supply interruption on the basis of the amount of stored power of the temporary power supply.

13. The computer program product of claim 12, the plurality of instructions further comprising instructions for enabling the data processing system to:
compare the amount of data stored in the volatile memory that is denoted as being data that should be written to the nonvolatile memory using power supplied by the temporary power supply in the event of a power supply interruption with the determined permitted amount of such data.

14. The computer program product of claim 13, the plurality of instructions further comprising instructions for enabling the data processing system:
when the amount of stored data denoted as being data that should be written to the nonvolatile memory using power supplied by the temporary power supply in the event of a power supply interruption is found to exceed the determined permitted amount of such data, instruct a firmware client component of the storage subsystem to reduce the amount of data it has denoted in the volatile memory as being data that should be written to the nonvolatile memory using power supplied by the temporary power supply in the event of a power supply interruption.

15. The computer program product of claim 14, the plurality of instructions further comprising instructions for enabling the data processing system to:
when the amount of stored data that is denoted as being data that should be written to the nonvolatile memory using power supplied by the temporary power supply in the event of a power supply interruption is found to exceed the determined permitted amount of such data, prevent the writing of any new data in the volatile memory that is denoted as being data that should be written to the nonvolatile memory using power supplied by the temporary power supply in the event of a power supply interruption, while the amount of data in the volatile memory that is denoted as being data that should be written to the nonvolatile memory using power supplied by the temporary power supply in the event of a power supply interruption exceeds the permitted amount of such data.

16. The computer program product of claim 15, the plurality of instructions further comprising instructions for enabling the data processing system to:
control the storage in the volatile memory of data that is denoted as being data that should be written to the nonvolatile memory using power supplied by the temporary power supply in the event of a power supply interruption on the basis of the nature of the data being stored and/or the nature of the client component requesting storage of the data in the volatile memory.

17. The computer program product of claim 16, the plurality of instructions further comprising instructions for enabling the data processing system to:

allocate memory capacity for data that is denoted as being data that should be written to the nonvolatile memory using power supplied by the temporary power supply in the event of a power supply interruption on the basis of the nature of the data being stored and/or the nature of the client component requesting storage of the data in the volatile memory.

18. The computer program product of claim 17, the plurality of instructions further comprising instructions for enabling the data processing system to:

give access to memory capacity for data that is denoted as being data that should be written to the nonvolatile memory using power supplied by the temporary power supply in the event of a power supply interruption preferentially to firmware client components of the storage subsystem that require such data storage to ensure data integrity.

19. The computer program product of claim 18, the plurality of instructions further comprising instructions for enabling the data processing system to:

control the storage in the volatile memory of data that is denoted as being data that should be written to a nonvolatile memory using power supplied by the temporary power supply in the event of an interruption in the power supply to the volatile memory by different firmware client components of the storage subsystem on the basis of the dependency of at least one of the client components on another client component or components for processing its input/output requests to the storage subsystem.

20. The computer program product of claim 19, the plurality of instructions further comprising instructions for enabling the data processing system to:

control the storage in the volatile memory of data that is denoted as being data that should be written to a nonvolatile memory using power supplied by the temporary power supply in the event of an interruption in the power supply to the volatile memory by different firmware client components of the storage subsystem on the basis of the ability of a or more than one of the client components to reduce the amount of data that it or they have stored in the volatile memory that is denoted as being data that should be written to a nonvolatile memory using power supplied by the temporary power supply in the event of an interruption in the power supply to the volatile memory.

* * * * *